US012588504B2

(12) United States Patent
Lim et al.

(10) Patent No.: US 12,588,504 B2
(45) Date of Patent: Mar. 24, 2026

(54) DIRECT COOLING TYPE POWER MODULE

(71) Applicants:Hyundai Motor Company, Seoul
(KR); Kia Corporation, Seoul (KR)

(72) Inventors: Suk Hyun Lim, Hwaseong-si (KR);
Tae Hwa Kim, Hwaseong-si (KR)

(73) Assignees: Hyundai Motor Company, Seoul
(KR); Kia Corporation, Seoul (KR)

( * ) Notice: Subject to any disclaimer, the term of this
patent is extended or adjusted under 35
U.S.C. 154(b) by 615 days.

(21) Appl. No.: 17/971,907

(22) Filed: Oct. 24, 2022

(65) Prior Publication Data

US 2023/0360996 A1 Nov. 9, 2023

(30) Foreign Application Priority Data

May 9, 2022 (KR) ........................ 10-2022-0056628

(51) Int. Cl.
*H01L 23/373* (2006.01)
*H01L 23/31* (2006.01)
*H01L 23/46* (2006.01)
(52) U.S. Cl.
CPC .......... *H01L 23/3733* (2013.01); *H01L 23/31*
(2013.01); *H01L 23/3735* (2013.01); *H01L*
*23/3736* (2013.01); *H01L 23/46* (2013.01)
(58) Field of Classification Search
CPC ......... H01L 23/46; H01L 23/42; H01L 23/22;
H01L 23/3733
See application file for complete search history.

(56) References Cited

U.S. PATENT DOCUMENTS

| | | | | |
|---|---|---|---|---|
| 4,233,645 A | * | 11/1980 | Balderes | ............. H01L 23/4338 |
| | | | | 361/698 |
| 9,293,680 B2 | | 3/2016 | Poliquin et al. | |
| 2019/0237425 A1 | * | 8/2019 | Dede | ..................... H01L 23/488 |
| 2019/0320534 A1 | * | 10/2019 | Degrenne | ......... H01L 23/49833 |
| 2024/0006264 A1 | * | 1/2024 | Lisec | .................. H01L 23/3733 |

FOREIGN PATENT DOCUMENTS

| | | | | | |
|---|---|---|---|---|---|
| DE | 10 2016 218 420 A1 | | 3/2018 | | |
| DE | 102016220755 A1 | * | 4/2018 | .............. | B22F 3/105 |
| DE | 102021202630 A1 | * | 9/2022 | .............. | H01F 1/24 |
| EP | 3208844 A1 | * | 8/2017 | ............. | G06F 1/206 |
| KR | 10-2019-0054301 A | | 5/2019 | | |
| WO | WO-2018055148 A1 | * | 3/2018 | | |

OTHER PUBLICATIONS

Office Action issued on Oct. 20, 2025 in Korean Patent Application
No. 10-2022-0056628.

* cited by examiner

*Primary Examiner* — Evren Seven
(74) *Attorney, Agent, or Firm* — Morgan, Lewis &
Bockius LLP

(57) ABSTRACT

A direct cooling type power module comprising, an enclo-
sure filled with an insulating fluid, a power semiconductor
device disposed inside the enclosure and a bonding unit
comprising a porous layer, and a thermally conductive layer
to which the power semiconductor device is bonded, and
allowing the power semiconductor device to exchange heat
with the insulating fluid by the porous layer and the ther-
mally conductive layer.

9 Claims, 3 Drawing Sheets

DIRECT COOLING TYPE POWER MODULE

The present application claims priority to Korean Patent Application No. 10-2022-0056628, filed May 9, 2022 in Korean Intellectual Property Office, the entire contents of which is incorporated herein for all purposes by this reference.

TECHNICAL FIELD

The disclosure relates to a direct cooling type power module, and more particularly to a direct cooling type power module, in which an insulating fluid for cooling is in direct contact with and cools a power semiconductor device that is a heating element, thereby simplifying a structure and improving cooling efficiency as compared with those of an indirect cooling type.

BACKGROUND

As one among the essential components of hybrid vehicles and electric vehicles, there is a power converter (for example, an inverter). The power converter is an essential part of an ecofriendly vehicle, and many technologies for the power converter have been developed. The key technology in the field of eco-friendly vehicles is to develop a power module that is an essential part in the power converter and accounts for the highest costs.

The key points in developing the major technologies for the power module are to reduce costs and improve cooling performance. When the power module is improved in the cooling performance, it is possible to lower the rated current of a power semiconductor device currently in use, and reduce the size of a chip, thereby decreasing the price of the chip and stably operating the power module.

To improve the performance of cooling the power module, the power module has conventionally been indirectly cooled in such a way that cooling channels where cooling water flows are in contact with the top and bottom surfaces of the power module.

However, such a conventional way has shortcomings in that cooling efficiency is low due to a long heat transfer path because the heat generated in the power semiconductor device, which is a heating element of the power module, is transferred to the top and bottom substrates and then reaches the cooling channels. In particular, a space is required to install a wire or the like forming an electrical connection, and therefore the power module applied to the conventional double-sided cooling method needs a separate structure, which is called a spacer, between the power semiconductor device and the substrate at one side. Such a spacer may cause problems of lowering heat transfer efficiency and increasing manufacturing costs.

Matters described as the related art are provided merely for promoting understanding for the background of the disclosure, and should not be taken as the prior art already known to a person having ordinary knowledge in the art.

SUMMARY

An aspect of the disclosure is to provide a direct cooling type power module, in which an insulating fluid for cooling is in direct contact with and cools a power semiconductor device that is a heating element, thereby simplifying a structure and improving a cooling efficiency as compared with those of an indirect cooling type one.

According to an embodiment of the disclosure, a direct cooling type power module includes: an enclosure filled with an insulating fluid; a power semiconductor device disposed inside the enclosure; and a bonding unit including a porous layer, and a thermally conductive layer to which the power semiconductor device is bonded, and allowing the power semiconductor device to exchange heat with the insulating fluid by the porous layer and the thermally conductive layer.

The enclosure may include an inlet and an outlet through which an inside and an outside are communicating to allow the insulating fluid to flow.

The enclosure may be internally provided with a supporter connected to the bonding unit and disposing the power semiconductor device and the bonding unit at an inner center thereof.

The porous layer may be made of aluminum or copper, and the thermally conductive layer may be made of the copper.

The bonding unit may include the thermally conductive layer including a top surface to which the power semiconductor device is bonded, and the porous layer bonded to one or both of the top and bottom surfaces of the thermally conductive layer.

The porous layers may include at least two portions disposed being spaced apart at opposite sides of the power semiconductor device on the top surface of the thermally conductive layer. Each of the opposite sides of the power semiconductor device are close to each of opposite sides of the bonding unit.

The bonding unit may include another power semiconductor device bonded to the bottom surface of the thermally conductive layer.

The bonding unit may include a plurality of porous layers and a plurality of thermally conductive layers, and the plurality of thermally conductive layers and the plurality of porous layers are alternately stacked in up and down directions.

The plurality of thermally conductive layers of the bonding unit may be respectively bonded to top and bottom surfaces of the power semiconductor device so that the power semiconductor device is interposed between the plurality of thermally conductive layers, and the plurality of thermally conductive layer and the plurality of porous layer may be alternately stacked without overlapping.

The bonding unit may include the porous layers disposed at the topmost and bottommost sides of a structure where the power semiconductor device, the porous layer, and the thermally conductive layer are stacked.

The power semiconductor device may include a plurality of power semiconductor devices, and a conductive wire may electrically connect the power semiconductor devices.

In the direct cooling type power module with the foregoing structure, an insulating fluid for cooling is in direct contact with a power semiconductor device that is a heating element, thereby simplifying a structure and improving a cooling efficiency as compared with those of an indirect cooling type one.

Further, the power semiconductor device is bonded to a bonding unit formed with many pores and made of a material with high thermal conductivity so that the efficiency of exchanging heat with the insulating fluid can be improved, thereby improving the efficiency of cooling the power semiconductor device.

In addition, not only manufacturing costs are reduced because the number of parts is remarkably decreased as compared with that of a conventional double-sided indirect cooling type power module, but also the lifespan or reliability of the power module is significantly improved because a crack or damage due to difference in a thermal expansion coefficient between bonded parts is prevented.

DETAILED DESCRIPTION

Figure 1:
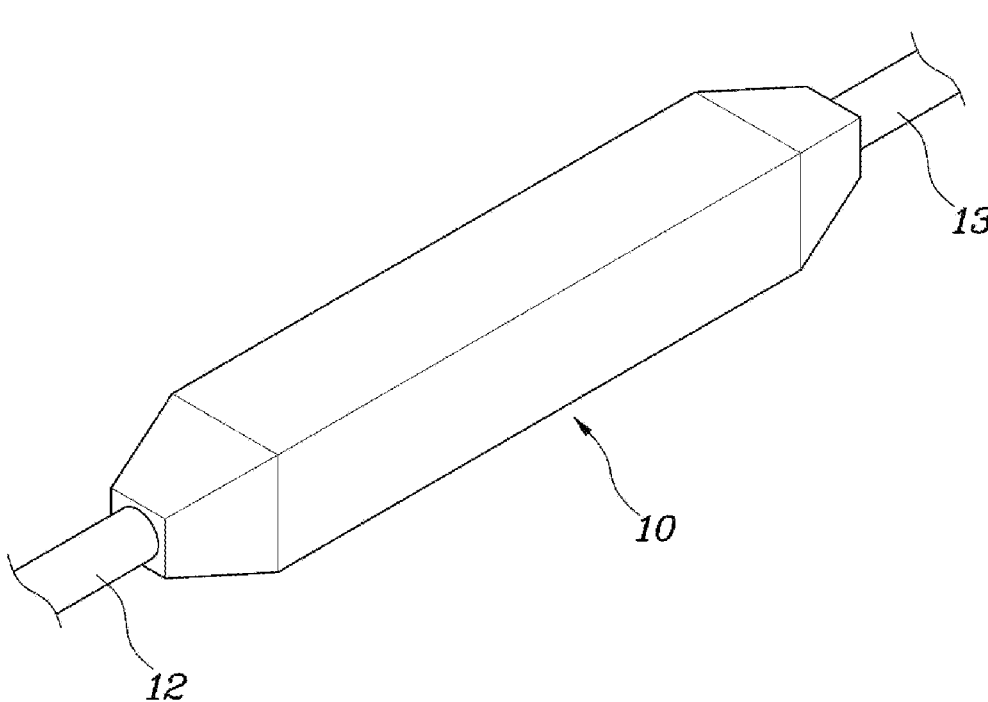
FIG. 1 is a view illustrating an enclosure of a direct cooling type power module according to the disclosure.

Hereinafter, a direct cooling type power module according to embodiments of the disclosure will be described with reference to the accompanying drawings.

Regarding embodiments of the disclosure disclosed in this specification or application, the specific structural or functional description is merely illustrative for the purpose of describing the embodiments of the disclosure, and embodiments of the disclosure may be implemented in various forms but not be construed as being limited to the embodiments set forth in this specification or application.

Because the embodiments of the disclosure may be variously modified and have various forms, specific exemplary embodiments will be illustrated in the drawings and described in detail in this specification or application. However, it should be understood that embodiments of the disclosure are intended not to be limited to the specific embodiments but to cover all modifications, equivalents or alternatives without departing from the spirit and technical scope of the disclosure.

Unless defined otherwise, all terms used herein including technical or scientific terms have the same meanings as those generally understood by a person having ordinary knowledge in the art to which the disclosure pertains. The terms such as those defined in generally used dictionaries are construed to have meanings matching that in the context of related technology and, unless clearly defined otherwise, are not construed to be ideally or excessively formal.

Below, the disclosure will be described in detail by describing embodiments with reference to the accompanying drawings. Like reference numerals in the drawings refer to like numerals.

Figure 2:
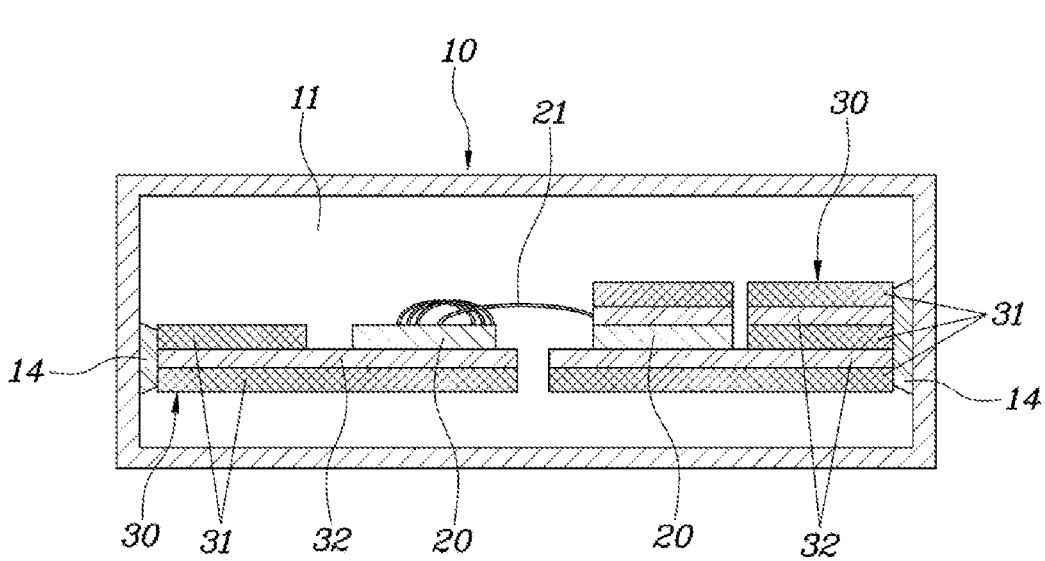
FIG. 2 is an internal configuration view illustrating a direct cooling type power module shown in FIG. 1.
Figure 3:
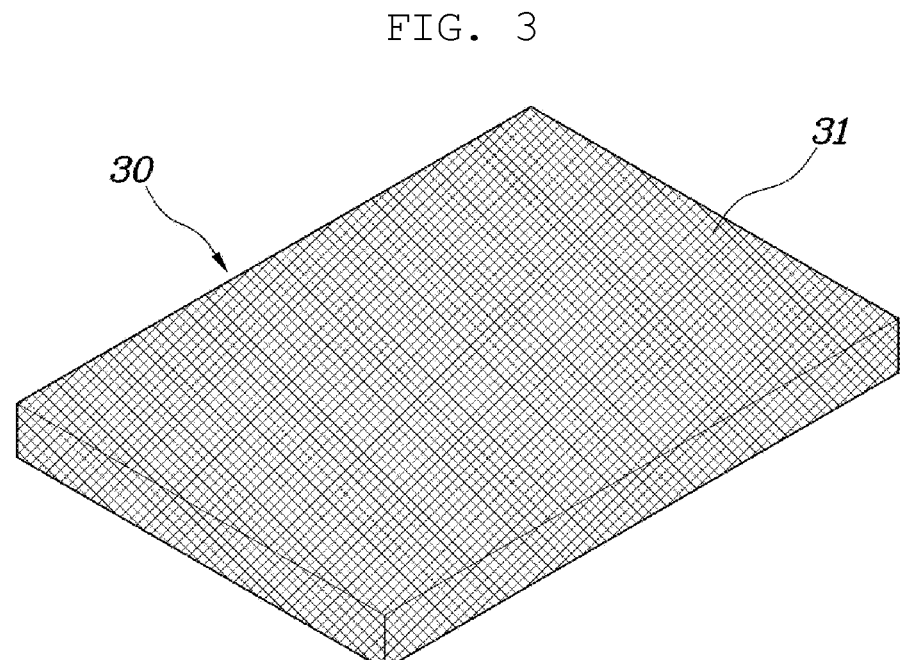
FIG. 3 is a view illustrating a bonding unit according to an embodiment of the disclosure.

FIG. 1 is a view illustrating an enclosure of a direct cooling type power module according to the disclosure, FIG. 2 is an internal configuration view illustrating a direct cooling type power module shown in FIG. 1, and FIG. 3 is a view illustrating a bonding unit according to an embodiment of the disclosure.

As shown in FIGS. 1 to 3, the direct cooling type power module according to the disclosure includes an enclosure 10 internally filled with an insulating fluid 11; a power semiconductor device 20 disposed inside the enclosure 10; and a bonding unit 30 including a porous layer 31 and a thermally conductive layer 32 to which the power semiconductor device 20 is bonded, and allowing the power semiconductor device 20 to exchange heat with the insulating fluid 11 through the porous layer 31 and the thermally conductive layer 32.

In other words, according to the disclosure, the enclosure 10 is internally filled with the insulating fluid 11 for cooling, and the power semiconductor device 20 is cooled by the insulating fluid 11. Here, the insulating fluid 11 flows in and out of the enclosure 10 and is managed to have a temperature optimized to cool the power semiconductor device 20. The insulating fluid 11 refers to a liquid insulator used as a refrigerant and exchanges heat with the power semiconductor device 20 which is a heating source.

In particular, according to the disclosure, the bonding unit 30 is provided to improve the performance of cooling the power semiconductor device 20. The bonding unit 30 includes the porous layer 31, and the thermally conductive layer 32, to which the power semiconductor device 20 is bonded.

Here, the porous layer 31 includes many micropores into which the insulating fluid 11 is introduced, thus increasing the area of contact with the insulating fluid 11, thereby securing heat transfer performance. The size of micropores in the porous layer 31 may be designed based on the amount of current or the amount of generated heat in the power semiconductor device 20, or based on the cooling performance of the insulating fluid 11.

Further, the thermally conductive layer 32 is bonded to the porous layer 31 and the power semiconductor device 20 so that the porous layer 31 and the power semiconductor device 20 can be strongly bonded by the thermally conductive layer 32.

In other words, the bonding unit 30 includes the porous layer 31 and the thermally conductive layer 32 to improve the heat exchange between the insulating fluid 11 and the power semiconductor device 20. The porous layer 31 is made of a material having porosity to maximize thermal transfer performance, and the thermally conductive layer 32 is shaped like a plate to be bonded easily to and give rigidity to the power semiconductor device 20. Thus, the power semiconductor device 20 smoothly exchanges heat with the bonding unit 30 and the insulating fluid 11, and is thus improved in cooling efficiency.

Specifically, according to the disclosure, the enclosure 10 may be shaped like a tub and made of insulating material. Further, the enclosure 10, the inside and outside of which are communicating, is formed with an inlet 12 and an outlet 13 through which the insulating fluid 11 flows. In other words, the enclosure 10 has an inner space to be filled with the insulating fluid 11, and the enclosure 10 includes the inlet 12 formed at one side and the outlet 13 formed at the other end, thereby forming a circulating structure in which the insulating fluid 11 introduced into the inlet 12 exchanges heat with the power semiconductor device 20 and the bonding unit 30 and is then discharged through the outlet 13. Therefore, channels through which the insulating fluid 11 is circulated may be connected to the inlet 12 and the outlet 13 of the enclosure 10, and another heat exchanger may be added onto the channels so that another cooling medium can exchange heat with the insulating fluid 11, thereby managing the temperature of the insulating fluid 11. In addition, the remaining portion of the enclosure 10 except for the inlet 12 and the outlet 13 has an airtight structure to prevent the insulating fluid 11 from leaking out through portions other than the inlet 12 and the outlet 13.

Further, the enclosure 10 is internally provided with a supporter 14 connected to the bonding unit 30, so that the power semiconductor device 20 and the bonding unit 30 can be disposed at the center inside the enclosure 10.

Here, the supporter 14 may be made of an insulating material, and may be formed integrally with the enclosure 10. In particular, the supporter 14 is connected to the bonding unit 30 inside the enclosure 10 so that the power semiconductor device 20 and the bonding unit 30 can be disposed at the center in the enclosure 10. The thermally conductive layer 32 of the bonding unit 30 may be connected to the supporter 14. Thus, the power semiconductor device 20 and the bonding unit 30 may sufficiently exchange heat with the insulating fluid 11 circulating in the enclosure 10. In addition, the positions of the power semiconductor device 20 and the bonding unit 30 are stabilized in the enclosure 10, thereby securing durability and reliability.

The power semiconductor device 20 may include an insulated gate bipolar transistor (IGBT), a diode or the like device for power conversion. The power semiconductor device 20 is disposed inside the enclosure 10 and bonded to the bonding unit 30, thereby forming an electric connection.

There may be provided a plurality of power semiconductor devices 20, and the power semiconductor devices 20 may be connected by conductive wires 21.

In other words, the power semiconductor device 20 receives an external control signal, and the current and voltage are to be converted. To this end, the conductive wire 21 connecting with the power semiconductor device 20 may be extended outside the enclosure 10. Therefore, the enclosure 10 employs resin, rubber, or the like airtight structure in the inlet 12, the outlet 13 and the like portion through which the conductive wire 21 passes, thereby preventing the insulating fluid 11 from leaking out.

Meanwhile, the porous layer 31 and the thermally conductive layer 32 may be made of a material having high terminal conductivity, for example, aluminum, copper, etc. Preferably, the porous layer 31 may be made of aluminum or copper, and the thermally conductive layer 32 may be made of copper. In other words, the porous layer 31 has many pores to maximize the performance of heat exchange with the insulating fluid 11 and the thermally conductive layer 32, and is made of a material having high thermal conductivity, such as aluminum, copper, and the like because it is only required to maintain a bonding state with regard to the thermally conductive layer 32. On the other hand, the thermally conductive layer 32 is made of a material having both thermal conductivity and rigidity because it is required to secure not only the performance of heat exchange with the insulating fluid 11, the porous layer 31, and the power semiconductor device 20 but also its rigidity and the performance of bonding the elements. Therefore, the thermally conductive layer 32 may be made of copper. Thus, the bonding unit 30 ensures that the porous layer 31 and the power semiconductor device 20 are bonded to the thermally conductive layer 32, and improves structural stability and heat exchange performance.

Meanwhile, the power semiconductor device 20 may be bonded to the top surface of the thermally conductive layer 32 of the bonding unit 30, and the porous layer 31 may be bonded to one of the top and bottom surfaces or both the top and bottom surfaces of the thermally conductive layer 32.

In other words, the power semiconductor device 20 may be bonded to the top surface of the thermally conductive layer 32, thereby securing the possibility of being bonded to the thermally conductive layer 32 and stably maintaining the bonding state. Of course, the power semiconductor device 20 may be bonded to the bottom surface of the thermally conductive layer 32, but the heat transfer performance may be degraded because the power semiconductor device 20 is likely to be separated from the thermally conductive layer 32 by its weight. Accordingly, the power semiconductor device 20 is bonded to the top surface of the thermally conductive layer 32.

Further, according to the cooling performance required in the power semiconductor device 20, the porous layer 31 may be bonded to only the top or bottom surface of the thermally conductive layer 32, or the porous layer 31 may be bonded to both the top and bottom surfaces of the thermally conductive layer 32. Thus, the performance of cooling the power semiconductor device 20 is improved because it not only directly exchanges heat with the insulating fluid 11 but also exchanges heat with the thermally conductive layer 32 bonding with at least one porous layer 31 and quickly cooled by the insulating fluid 11.

In this way, the porous layer 31 may be formed on one of the first and second surfaces of the thermally conductive layer 32 or may be formed on both the first and second surfaces of the thermally conductive layer 32, depending on the cooling performance required in the power semiconductor device 20.

In detail, the bonding unit 30 may include the porous layers 31 disposed on the top surface of the thermally conductive layer 32 and spaced apart at the opposite sides of the power semiconductor device 20. As the power semiconductor device 20 and the porous layer 31 are bonded to the thermally conductive layer 32, and the porous layers 31 are provided at the opposite sides of the power semiconductor device 20, the power semiconductor device 20 is improved in performance by being cooled between the plurality of porous layers 31 by the thermally conductive layer 32. In addition, the thermally conductive layers 32 are disposed at the opposite sides with respect to the power semiconductor device 20, so that the power semiconductor device 20 can be cooled in balance. In particular, the power semiconductor device 20 is spaced from the porous layer 31, and thus prevented from being short-circuited with the porous layer 31.

Further, the bonding unit 30 may be extended so that the bottom surface of the thermally conductive layer 32 can encompass the power semiconductor device 20 and the porous layer 31 which are bonded to the top surface of the thermally conductive layer 31. In other words, there is no risk of being electrically short circuited because the power semiconductor device 20 is not bonded to the bottom surface of the thermally conductive layer 32, and therefore the porous layer 31 is provided throughout the bottom surface of the thermally conductive layer 32, thereby securing the cooling performance. Here, the porous layer 31 may be not only extended but also divided into a plurality of porous layers 31 on the bottom surface of the thermally conductive layer 32, and disposed on the bottom surface of the thermally conductive layer 32 so as to include the power semiconductor device 20 and the porous layer 31, which are bonded to the top surface of the thermally conductive layer 32, thereby maximizing the performance for cooling the power semiconductor device 20 through the thermally conductive layer 32.

Meanwhile, the bonding unit 30 may include a plurality of porous layers 31 and a plurality of thermally conductive layers 32, and the thermally conductive layers 32 and the porous layers 31 may be alternately stacked in up and down directions.

When the porous layers 31 and the thermally conductive layers 32 are formed as a multi-layered structure, the contact area with the insulating fluid 11 is increased, thereby improving the cooling performance. Further, the porous layer 31 and the thermally conductive layer 32 may be alternately stacked without overlapping in the up and down directions, thereby stabilizing the structure where the plurality of thermally conductive layers 32 are stacked with the porous layer 31 therebetween. Here, the number of porous layers 31 and thermally conductive layers 32 to be stacked may be varied depending on the cooling performance required in the power semiconductor device 20.

Further, the thermally conductive layers 32 of the bonding unit 30 are bonded to the top and bottom surfaces of the power semiconductor device 20, and then interposed between the thermally conductive layers 32, and the plurality of thermally conductive layers 32 and porous layers 31 are alternately stacked without overlapping.

As shown in FIG. 2, the power semiconductor device 20 is interposed between the thermally conductive layers 32, and exchanges heat with the thermally conductive layers 32 bonded to both sides thereof, thereby securing the cooling performance. Further, the thermally conductive layers 32 bonded to both sides of the power semiconductor device 20 are stacked alternately with the porous layers 31, so that the contact area between the porous and thermally conductive layers 31 and 32 and the insulating fluid 11 can increase, thereby improving the cooling performance based on the insulating fluid 11, and maximizing the heat dissipation performance of the power semiconductor device 20 through the heat exchange between the porous layer 31 and the thermally conductive layer 32.

Here, the bonding unit 30 may include the porous layers 31 disposed at the topmost and bottommost sides of the structure where the power semiconductor device 20, the porous layers 31, and the thermally conductive layers 32 are stacked. In this way, the bonding unit 30 includes the porous layers 31 disposed at the outermost sides of the structure where the porous layer 31 and the thermally conductive layer 32 are stacked, thereby securing the cooling performance based on the insulating fluid 11. In other words, the porous layer 31 formed with many micropores secures the area of contact with the insulating fluid 11 as compared with the thermally conductive layer 32 formed as a solid plate, and is thus disposed at each outermost side of the stacked structure of the bonding unit 30, thereby preventing the contact area of the porous layer 31 from being decreased by the thermally conductive layer 32, and securing the cooling performance.

In the direct cooling type power module with the foregoing structure, an insulating fluid for cooling is in direct contact with a power semiconductor device that is a heating element, thereby simplifying a structure and improving a cooling efficiency compared with those of an indirect cooling type one.

Further, the power semiconductor device is bonded to a bonding unit foiled with many pores and made of a material with high thermal conductivity so that the efficiency of exchanging heat with the insulating fluid can be improved, thereby improving the efficiency of cooling the power semiconductor device.

In addition, not only manufacturing costs are reduced because the number of parts is remarkably decreased as compared with that of a conventional double-sided indirect cooling type power module, but also the lifespan or reliability of the power module is significantly improved because a crack or damage due to difference in a thermal expansion coefficient between bonded parts is prevented.

Although specific embodiments of the disclosure are illustrated and described, it will be obvious to a person having ordinary knowledge in the art that a variety of improvements and changes can be made in the disclosure without departing from the technical idea of the disclosure defined in the appended claims.

What is claimed is:

1. A direct cooling type power module comprising:
   an enclosure filled with an insulating fluid;
   a power semiconductor device disposed inside the enclosure; and
   a bonding unit comprising a porous layer, and a thermally conductive layer to which the power semiconductor device is bonded, and allowing the power semiconductor device to exchange heat with the insulating fluid by the porous layer and the thermally conductive layer,
   wherein the enclosure is internally provided with a supporter connected to the thermally conductive layer of the bonding unit and disposing the power semiconductor device and the bonding unit at an inner center thereof,
   the supporter being provided to protrude inwardly from the enclosure, wherein the bonding unit comprises a plurality of bonding units disposed to be spaced from each other in the enclosure and a conductive wire electrically connects the plurality of bonding units.

2. The direct cooling type power module of claim 1, wherein the enclosure comprises an inlet and an outlet through which an inside and an outside are communicating to allow the insulating fluid to flow.

3. The direct cooling type power module of claim 1, wherein the porous layer comprises aluminum or copper, and the thermally conductive layer is made of the copper.

4. The direct cooling type power module of claim 1, wherein the thermally conductive layer comprises a top surface to which the power semiconductor device is bonded, and the porous layer is
   bonded to one or both of the top surface and a bottom surface of the thermally conductive layer.

5. The direct cooling type power module of claim 4, wherein the porous layer comprises at least two portions which are disposed being spaced at opposite sides of the power semiconductor device on the top surface of the thermally conductive layer, each of the opposite sides of the power semiconductor device are close to each of opposite sides of the bonding unit.

6. The direct cooling type power module of claim 4, wherein the bonding unit comprises another power semiconductor device bonded to the bottom surface of the thermally conductive layer.

7. The direct cooling type power module of claim 1, wherein the bonding unit comprises a plurality of porous layers and a plurality of thermally conductive layers, and the plurality of thermally conductive layers and the plurality of porous layers are alternately stacked in up and down directions.

8. The direct cooling type power module of claim 7, wherein the plurality of thermally conductive layers of the bonding unit are respectively bonded to top and bottom surfaces of the power semiconductor device so that the power semiconductor device is interposed between the plurality of thermally conductive layers, and the plurality of thermally conductive layers and the plurality of porous layers are alternately stacked without overlapping.

9. The direct cooling type power module of claim 7, wherein the bonding unit comprises one or more porous layers of the plurality of porous layers disposed at topmost and bottommost sides of the bonding unit.

* * * * *